(12) United States Patent
Hirabayashi et al.

(10) Patent No.: US 8,334,959 B2
(45) Date of Patent: Dec. 18, 2012

(54) ELECTRO-OPTICAL DEVICE AND ELECTRONIC APPARATUS INCLUDING A SEALED WIRING PORTION CONNECTED TO AN ELECTROSTATIC PROTECTION CIRCUIT

(75) Inventors: Yukiya Hirabayashi, Suwa (JP); Takashi Sato, Chino (JP)

(73) Assignee: Sony Corporation, Tokyo (JP)

( * ) Notice: Subject to any disclaimer, the term of this patent is extended or adjusted under 35 U.S.C. 154(b) by 503 days.

(21) Appl. No.: 11/492,014

(22) Filed: Jul. 25, 2006

(65) Prior Publication Data

US 2007/0030434 A1 Feb. 8, 2007

(30) Foreign Application Priority Data

Aug. 2, 2005 (JP) ................................ 2005-224123
Apr. 14, 2006 (JP) ................................ 2006-111990

(51) Int. Cl.
*G02F 1/1345* (2006.01)
*G02F 1/1333* (2006.01)
*G02F 1/1339* (2006.01)
*G09G 3/36* (2006.01)
*G09G 5/00* (2006.01)
*G06F 3/038* (2006.01)

(52) U.S. Cl. .......... 349/149; 349/40; 349/153; 345/104; 345/206

(58) Field of Classification Search ................ 349/139, 349/149, 40, 54, 152, 153; 345/87, 104, 345/205, 206
See application file for complete search history.

(56) References Cited

U.S. PATENT DOCUMENTS

| 5,220,443 | A | * | 6/1993 | Noguchi ....................... 349/139 |
| 5,521,728 | A | * | 5/1996 | Kodate et al. ................. 349/149 |
| 5,831,709 | A | * | 11/1998 | Song ............................. 349/149 |
| 5,909,035 | A | * | 6/1999 | Kim ................................ 257/59 |
| 5,930,607 | A | * | 7/1999 | Satou ............................ 438/158 |
| 5,953,086 | A | * | 9/1999 | Oogiichi et al. .............. 349/139 |
| 6,262,702 | B1 | | 7/2001 | Murade |
| 7,372,514 | B2 | * | 5/2008 | Matsumoto et al. ........... 349/55 |

FOREIGN PATENT DOCUMENTS

| CN | 1388404 A | 1/2003 |
| JP | 09-297321 | * 11/1997 |
| JP | A 9-297321 | 11/1997 |
| JP | B2 2744138 | 2/1998 |
| JP | B2 2763149 | 4/1998 |
| JP | A 11-142887 | 5/1999 |
| JP | A 11-202367 | 7/1999 |
| JP | A 2000-019556 | 1/2000 |
| JP | A 2000-098421 | 4/2000 |
| JP | B2 3223614 | 8/2001 |
| KR | B1 0151296 | 3/1997 |
| KR | 2002-0057030 | 7/2002 |
| WO | WO 95/14059 | 5/1995 |

* cited by examiner

*Primary Examiner* — Mark Robinson
*Assistant Examiner* — Paisley L Arendt
(74) *Attorney, Agent, or Firm* — K&L Gates LLP

(57) ABSTRACT

An electro-optical device having a display region in which a plurality of pixels are arranged in a matrix includes: switching elements each corresponding to one the plurality of pixels; a first sealed wiring portion that is formed on an element substrate so as to surround at least three sides of the display region; and a second sealed wiring portion that surrounds the first sealed wiring portion.

13 Claims, 7 Drawing Sheets

ELECTRO-OPTICAL DEVICE AND ELECTRONIC APPARATUS INCLUDING A SEALED WIRING PORTION CONNECTED TO AN ELECTROSTATIC PROTECTION CIRCUIT

BACKGROUND

1. Technical Field

The present invention relates to an electro-optical device and an electronic apparatus.

2. Related Art

In an active-matrix-type liquid crystal device (electro-optical device), a switching element is connected to each pixel electrode and the pixel electrode is switched by the switching element. For example, a thin film transistor (TFT) can be used as a switching element. The structure and operation of the thin film transistor are basically the same as those of a MOS transistor formed of single crystal silicon. As the structure of a thin film transistor formed of amorphous silicon (a-Si), a bottom gate structure (inverted staggered structure) in which gate electrodes are disposed below an amorphous silicon layer is generally used.

When manufacturing the thin film transistor, it is important to reduce the number of manufacturing processes and to increase the manufacturing yield. In addition, it is also important to effectively protect the thin film transistor against electrostatic damage that may occur during the manufacture of an active matrix substrate. A technique of protecting the thin film transistor against the electrostatic damage is disclosed in Japanese Patent Publication No. 2744138.

According to the technique disclosed in Japanese Patent Publication No. 2744138, it is assumed that the thin film transistor can be protected against electrostatic damage occurring during a manufacturing process. However, static electricity may be generated during a process of manufacturing an electro-optical device, and in addition, the static electricity may be generated, for example, even during a process of mounting the electro-optical device in an electronic apparatus, a process of carrying the electro-optical device, and a process of packing the electro-optical device after the electro-optical device has been manufactured. Therefore, in order to ensure the reliability of the electro-optical device, it is necessary to effectively protect the electro-optical device against electrostatic damage even while the electro-optical device is being used as well as during the manufacturing process.

SUMMARY

An advantage of some aspects of the invention is that it provides an electro-optical device which has a configuration capable of reliably protecting active elements thereof against electrostatic damage and, preferably, in which a manufacturing process can be efficient and the manufacturing yield can be improved.

According to an aspect of the invention, an electro-optical device having a display region in which a plurality of pixels are arranged in a matrix includes: switching elements each corresponding to one of the plurality of pixels; a first sealed wiring portion that is formed on an element substrate so as to surround at least three sides of the display region; and a second sealed wiring portion that surrounds the first sealed wiring portion.

In the configuration described above, since the switching elements in the display region are doubly protected by the first sealed wiring portion and the second sealed wiring portion, it is possible to provide an electro-optical device having high resistance to the static electricity.

Further, in the electro-optical device described above, preferably, at least one of the first and second sealed wiring portions is formed in a rectangular shape surrounding the display region. This causes the resistance to the static electricity to be even higher.

Furthermore, in the electro-optical device described above, preferably, the first and second sealed wiring portions are electrically connected to a common electrode that is formed to correspond to the plurality of pixels. With this configuration, it is possible to provide an electro-optical device in which a surge can flow through a common electrode wiring line.

Furthermore, in the electro-optical device described above, preferably, a common electrode wiring line that is formed on the element substrate so as to be electrically connected to the common electrode formed to correspond to the plurality of pixels is further provided, and the common electrode wiring line forms a third sealed wiring portion that surrounds at least three sides of the display region. In this configuration, since the display region is partially surrounded trebly, it is possible to obtain much higher resistance to the static electricity.

Furthermore, in the electro-optical device described above, preferably, each of the switching elements includes a thin film transistor having a gate electrode formed on the element substrate, a semiconductor layer opposite to the gate electrode with a gate insulating layer interposed therebetween, and a source electrode and a drain electrode which are electrically connected to the semiconductor layer, and any one of the first and second sealed wiring portions is formed on the same layer as the source electrode and the drain electrode by using the same material as the source electrode and the drain electrode. In this configuration, since the sealed wiring portion can be formed at the same time as the pixels in the display region are formed, the invention is advantageous in terms of a manufacturing efficiency and a manufacturing yield.

Furthermore, in the electro-optical device described above, preferably, any one of the first and second sealed wiring portions is formed on the same layer as the gate electrode by using the same material as the gate electrode. Even in this case, since the sealed wiring portion can be formed at the same time as the pixels in the display region are formed, the invention is advantageous in terms of the manufacturing efficiency and the manufacturing yield.

Furthermore, in the electro-optical device described above, preferably, pixel electrodes each of which is electrically connected to the corresponding switching elements through the source electrode and the drain electrode is further provided, and any one of the first and second sealed wiring portions is formed on the same layer as the pixel electrodes by using the same material as the pixel electrodes. Even in this case, since the sealed wiring portion can be formed at the same time as the pixels in the display region are formed, the invention is advantageous in terms of the manufacturing efficiency and the manufacturing yield.

Furthermore, in the electro-optical device described above, preferably, pixel electrodes each of which is electrically connected to the corresponding switching elements through the source electrode and the drain electrode is further provided, and at least two of the first, second, and third sealed wiring portions are electrically connected to each other by a connecting member that is formed on the same layer as the pixel electrodes by using the same material as the pixel electrodes. In this configuration, even though the sealed wiring portions are formed in different wiring layers, the sealed wiring portions can be easily connected to each other by the connecting member formed on the same layer as the pixel electrodes. Accordingly, it is possible to easily form a path through which the surge can flow.

Furthermore, in the electro-optical device described above, it is preferable to further include a plurality of data lines formed on the element substrate and a plurality of scanning lines formed on the element substrate so as to intersect the plurality of data lines. In addition, preferably, the pixels are respectively formed to correspond to intersections of the data lines and the scanning lines, and the first sealed wiring portion or the second sealed wiring portion is electrically connected to the scanning lines or the data lines through at least one electrostatic protection circuit. In this configuration, since the switching elements can be protected by the electrostatic protection circuit, it is possible to obtain much higher resistance to the static electricity.

Furthermore, in the electro-optical device described above, preferably, the electrostatic protection circuit includes a MOS diode having a semiconductor layer that is formed on the same layer as the thin film transistor. In addition, preferably, the electrostatic protection circuit is formed by connecting the first MOS diode and the second MOS diode in opposite directions, each of the first and second MOS diodes being formed by making a gate electrode and a drain electrode of the corresponding thin film transistor short-circuited. In this configuration, since the electrostatic protection circuit can be formed at the same time as the pixels are formed, it is possible to provide an electro-optical device having a high manufacturing efficiency.

Furthermore, in the electro-optical device described above, preferably, the first MOS diode is a capacitance-coupled MOS diode in which a source electrode and a gate electrode overlap each other in plan view, and the second MOS diode is a capacitance-coupled MOS diode in which a source electrode and a gate electrode partially overlap each other in plan view. With this configuration, it is possible to operate the protection circuit in an early stage of a manufacturing process. Accordingly, it is possible to effectively prevent the switching elements from being damaged during the manufacturing process, which improves the manufacturing yield.

Furthermore, in the electro-optical device described above, preferably, the capacitance-coupled MOS diode is electrically connected to the corresponding sealed wiring portion formed on the same layer as the data lines. Even in this configuration, it is possible to operate the protection circuit from immediately after forming the data lines. Accordingly, it is possible to effectively prevent the switching elements from being damaged during the manufacturing process, which improves the manufacturing yield.

In addition, according to another aspect of the invention, an electronic apparatus includes the electro-optical device described above. In this configuration, it is possible to effectively protect circuits, such as the switching elements, against the static electricity by means of the sealed wiring portion. Accordingly, it is possible to provide an electronic apparatus having a highly reliable display unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1A:
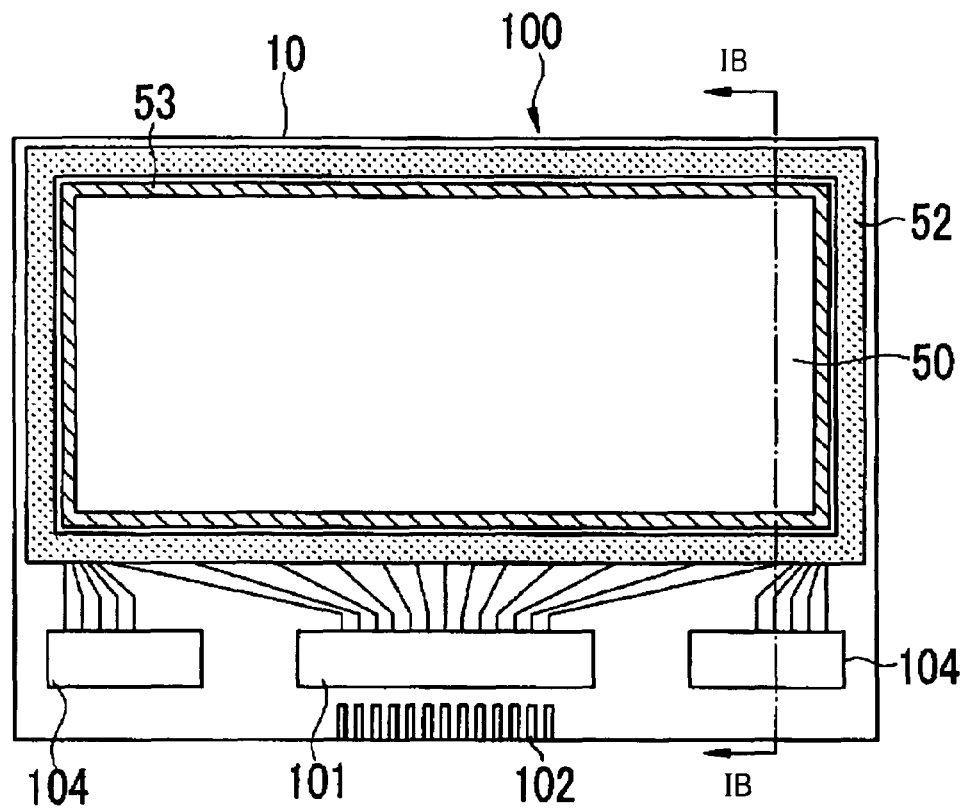
FIG. 1A is a view illustrating an overall configuration of a liquid crystal device according to a first embodiment of the invention.
Figure 1B:
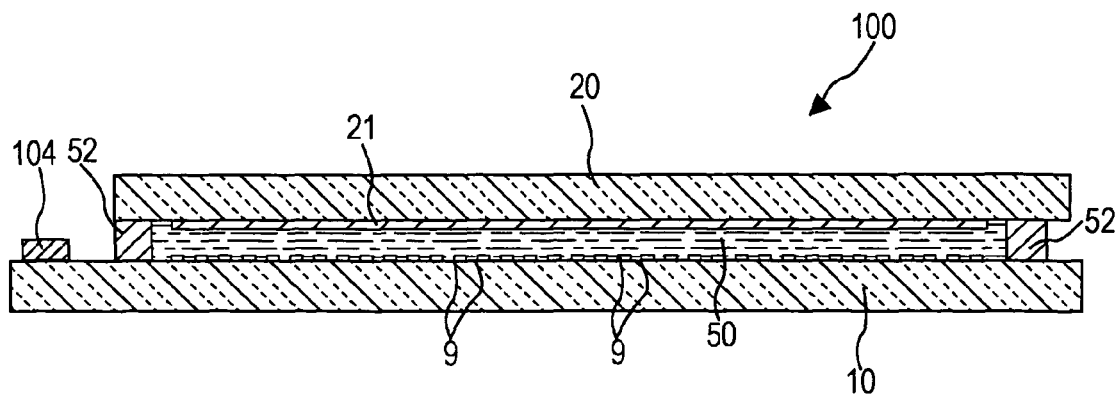
FIG. 1B is a cross-sectional view taken along the line IB-IB of FIG. 1A.

FIG. 1A is a plan view illustrating an overall configuration of a liquid crystal device 100, which is an example of an electro-optical device according to a first embodiment of the invention, and FIG. 1B is a cross-sectional view taken along the line IB-IB of FIG. 1A.

As shown in FIGS. 1A and 1B, in the liquid crystal device 100, a TFT array substrate (element substrate) 10 and a counter substrate 20 are bonded to each other by means of a sealant 52 having approximately a rectangular frame shape in plan view, and liquid crystal (electro-optical material) 50 is sealed between the substrates 10 and 20 by means of the sealant 52.

A light shielding layer (shown by a hashed area) 53 formed of a light shielding material is formed in a rectangular frame shape along an inner periphery of the sealant 52. In a peripheral circuit region located outside the sealant 52, a data line driving circuit 101 and mounting terminals 102 are provided along one side of the TFT array substrate 10 and scanning line driving circuits 104 are provided to be adjacent to both ends of the data line driving circuit 101 along the one side of the TFT array substrate 10.

On an inner surface (surface facing the liquid crystal 50) of the TFT array substrate 10, a plurality of pixel electrodes 9 are formed and an alignment layer (not shown) is formed to cover the pixel electrodes 9. On an inner surface of the counter substrate 20, a common electrode 21 having a planar shape is formed. In addition, an alignment layer (not shown) is formed to cover the common electrode 21.

Figure 2:
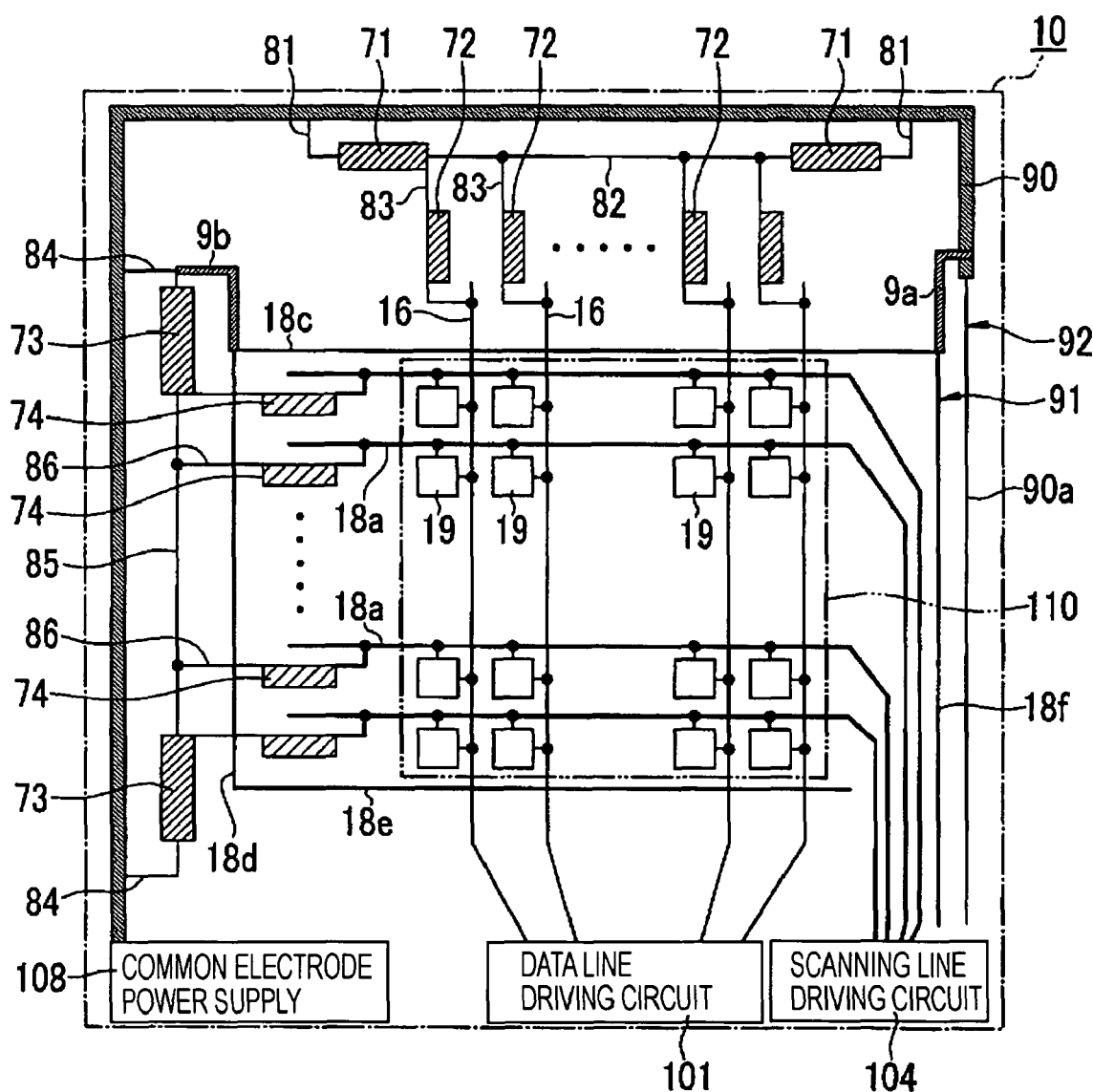
FIG. 2 is a circuit diagram schematically illustrating an electrical configuration of a TFT array substrate.
Figure 3:
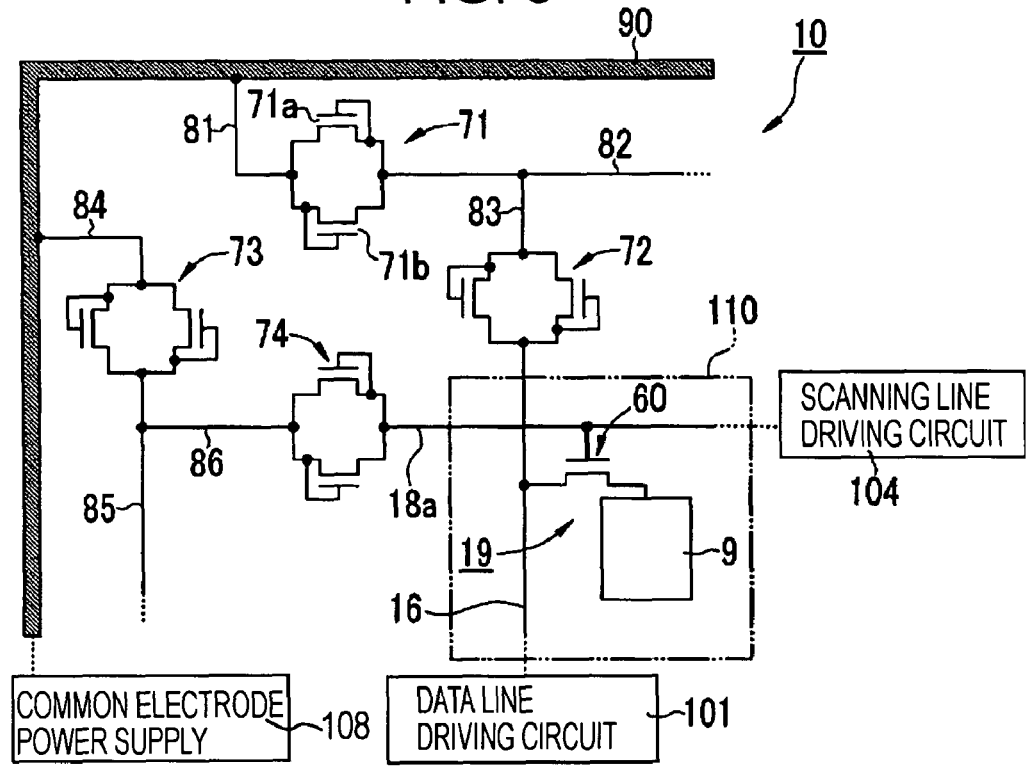
FIG. 3 is a detailed circuit diagram illustrating an upper left portion of the circuit shown in FIG. 2.

FIG. 2 is a circuit diagram schematically illustrating an electrical configuration of the TFT array substrate 10. FIG. 3 is a detailed circuit diagram illustrating an upper left portion of the circuit shown in FIG. 2.

A display region 110 having approximately a rectangular shape in plan view is formed within a planar area of the TFT array substrate 10, and a plurality of pixels 19 arranged in a matrix in plan view are provided in the display region 110. Within the display region 110, a plurality of data lines 16 and a plurality of scanning lines 18a, which extend from the outside of the display region 110, are formed. Each of the data lines 16 and each of the scanning lines 18a are electrically connected to corresponding pixels 19 in the vicinity of each of the intersections of the data lines 16 and the scanning lines 18a.

Here, as shown in FIG. 3, each of the pixels 19 formed within the display region 110 is provided with a TFT 60 and a pixel electrode 9 electrically connected to a drain of the TFT 60. Each of the data lines 16 to which image signals are supplied is electrically connected to a source of the TFT 60, and each of the scanning lines 18a is electrically connected to a gate of the TFT 60.

In each of the pixels 19 having the configuration described above, an image signal supplied from the corresponding data line 16 is written into the pixel electrode 9 at a predetermined timing by turning on the TFT 60, serving as a switching element, only for a predetermined period of time by means of a scanning signal supplied through the corresponding scanning line 18a.

The image signals, each having a predetermined level, which are written into liquid crystal 50 by the pixel electrodes 9, are held between the pixel electrodes 9 and the common electrode 21 opposite to the pixel electrodes 9 with the liquid crystal 50 interposed therebetween for a predetermined period of time. In addition, since the alignment or the order of a set of molecules of the liquid crystal changes according to the level of the voltage applied to the liquid crystal, it is possible to modulate light so as to make a predetermined gray-scale display.

Further, in each of the pixels 19, in order to prevent the image signals written in the liquid crystal from leaking, a storage capacitor may be added in parallel to a liquid crystal capacitance formed between each of the pixel electrodes 9 and the common electrode 21. In this case, capacitive lines extending in parallel to the scanning lines 18a are formed on the TFT array substrate 10.

Referring back to FIG. 2, the data lines 16, each being electrically connected to the corresponding pixels 19, extend to the outside (lower side in FIG. 2) of the display region 110 so as to be electrically connected to the data line driving circuit 101. The other end of each of the data lines 16 is electrically connected to a corresponding electrostatic protection circuit 72. Each electrostatic protection circuit 72 is electrically connected to two electrostatic protection circuits 71 through connection wiring lines 83 and 82. In addition, each electrostatic protection circuit 71 is electrically connected to a common electrode wiring line 90 through a connection wiring line 81.

The scanning lines 18a, each being electrically connected to the corresponding pixels 19, extend to the outside (right side in FIG. 2) of the display region 110 so as to be electrically connected to the scanning line driving circuit 104. The other end of each of the scanning lines 18a extends to the outside (left side in FIG. 2) of the display region 110 so as to be electrically connected to an electrostatic protection circuit 74. Each electrostatic protection circuit 74 is electrically connected to two electrostatic protection circuits 73 through connection wiring lines 86 and 85. In addition, each of the two electrostatic protection circuits 73 is electrically connected to the common electrode wiring line 90 through a connection wiring line 84.

Furthermore, a first sealed wiring portion 91 including four wiring members 18c to 18f is provided, the four wiring members 18c to 18f extending to surround the display region 110. Referring to FIG. 2, the wiring member 18c extends in the left and right directions between the display region 110 and the electrostatic protection circuits 72 disposed along the arrayed direction of the data lines 16. The wiring member 18d extends in the up and down directions between the connection wiring line 85 and the electrostatic protection circuits 74 disposed along the arrayed direction of the scanning lines 18a. The wiring member 18e extends from a lower end of the wiring member 18d to the right side of the drawing and also extends along a lower side of the display region 110. The wiring member 18f extends in the up and down directions between the scanning lines 18a, which extend from the display region 110 and are connected to the scanning line driving circuit 104, and the wiring member 90a extending along a right side of the TFT array substrate 10.

A left end of the wiring member 18c and an upper end of the wiring member 18d are electrically connected to each other, and at the same time, the left end of the wiring member 18c and the upper end of the wiring member 18d are electrically connected to the connection wiring line 84 through a connecting member 9b. In addition, a right end of the wiring member 18c and an upper end of the wiring member 18f are electrically connected to each other, and at the same time, the right end of the wiring member 18c and the upper end of the wiring member 18f are electrically connected to the common electrode wiring line 90 through a connecting member 9a.

Accordingly, the wiring members 18c, 18d, 18e, and 18f are electrically connected to one another, and at the same time, the wiring members 18c, 18d, 18e, and 18f are electrically connected to the common electrode wiring line 90 through the connecting members 9a and 9b.

As shown in FIG. 2, the common electrode wiring line 90 has approximately a hook shape extending from the left side of the TFT array substrate 10 to the right side of the TFT array substrate 10 through the upper side of the TFT array substrate 10, and the common electrode wiring line 90 is electrically connected to a common electrode power supply 108 at one end of the left side of the TFT array substrate 10. Further, at the right side of the TFT array substrate 10, the common electrode wiring line 90 is electrically connected to the wiring member 90a having a narrow width. Accordingly, from an electrical point of view, the common electrode wiring line 90 and the wiring member 90a are disposed to surround three sides of the display region 110, which forms a second sealed wiring portion 92.

In the present embodiment, the wiring members 18c, 18d, 18e, and 18f are formed on the same layer as the scanning lines 18a by using the same material as the scanning lines 18a. On the other hand, the connection wiring lines 81 to 86, the common electrode wiring line 90, and the wiring member 90a are formed on the same layer as the data lines 16 by using the same material as the data lines 16. The connection wiring lines 86, each of which is electrically connected to one end of the corresponding electrostatic protection circuit 74, and the scanning lines 18a, each of which is electrically connected to the other end of the corresponding electrostatic protection circuit 74, are formed on different wiring layers; however, an electrical connection between the different wiring layers is made through the electrostatic protection circuits 74.

Next, the electrostatic protection circuits 71 to 74 will be described with reference to FIG. 3. FIG. 3 is a detailed circuit diagram illustrating the upper left portion of the circuit shown in FIG. 2.

As shown in FIG. 3, the electrostatic protection circuit 71 includes a first MOS diode 71a having a gate and a drain connected to each other and a second MOS diode 71b having a gate and a drain connected to each other, the first MOS diode 71a and the second MOS diode 71b being connected in opposite directions to each other. In addition, a source (drain of the second MOS diode 71b) of the first MOS diode 71a and the connection wiring line 81 are electrically connected to each other, and a drain (source of the second MOS diode 71b) of the first MOS diode 71a and the connection wiring line 82 are electrically connected to each other. This configuration is applied to the other electrostatic protection circuits 72 to 74 in approximately the same manner.

Each of the electrostatic protection circuits 71 to 74 constructed as described above has a bidirectional non-linearity in current voltage characteristics. Each diode changes to a high impedance state when a low voltage is applied and changes to a low impedance state when a high voltage is applied. In addition, since each diode is substantially a transistor, each diode has a high capability of making a current flow and can absorb static electricity at high speed. Accordingly, a high electrostatic protection capability can be obtained.

In the configuration described above, each of the electrostatic protection circuits 71 to 74 is turned on when a positive or negative excessive surge is applied. At this time, since the electrostatic protection circuits 71 to 74 serve to cause the surge to flow through the common electrode wiring line 90 (LC COM.), the TFTs 60 within the display region 110 can be protected.

Figure 4:
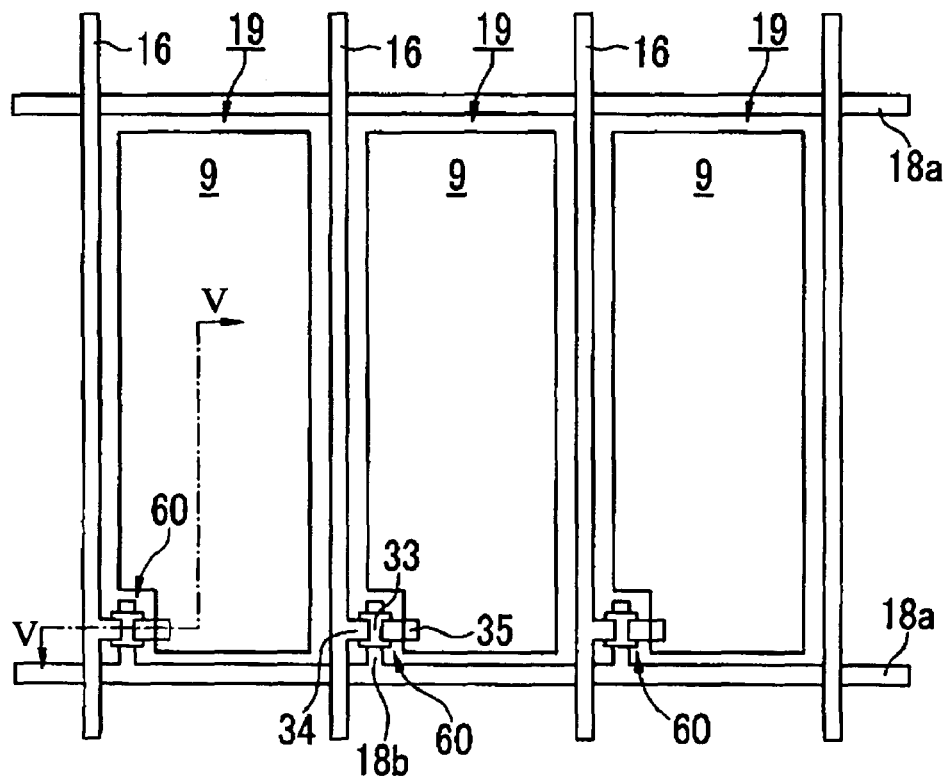
FIG. 4 is a plan view illustrating a configuration of a pixel of the liquid crystal device.
Figure 5:
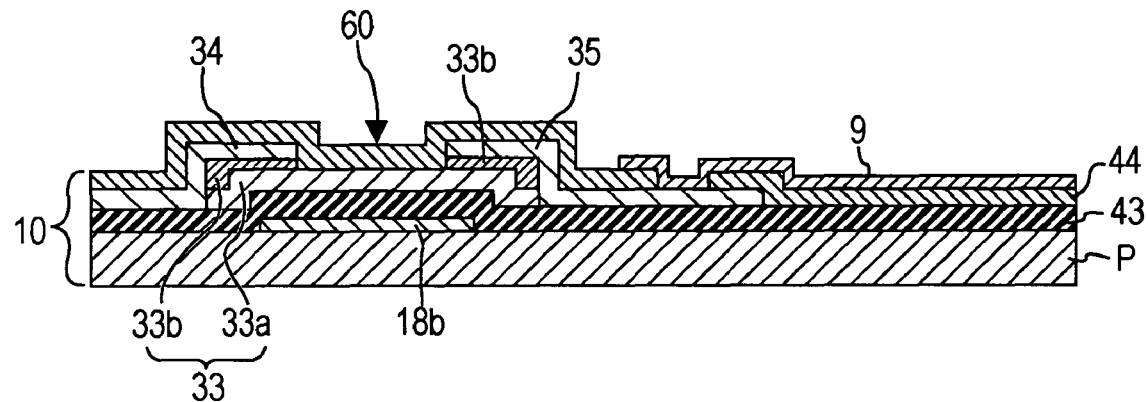
FIG. 5 is a cross-sectional view taken along the line V-V of FIG. 4.

Next, the configuration of a pixel of the liquid crystal device 100 will be described with reference to FIGS. 4 and 5. FIG. 4 is a plan view illustrating the configuration of a pixel of the liquid crystal device 100. FIG. 5 is a cross-sectional view taken along the line V-V of FIG. 4 when the liquid crystal device 100 is a reflective liquid crystal device or a transmissive liquid crystal device.

As shown in FIG. 4, in the display region of the liquid crystal device 100, the plurality of scanning lines 18a extend in the left and right directions and the plurality of data lines 16 extend to intersect the scanning lines 18a. In FIG. 4, a region, which is surrounded by the adjacent scanning lines 18a and the adjacent data lines 16 and has a rectangular shape in plan view, is a pixel region (pixel 19).

Within each pixel region, the pixel electrode 9, which is formed by a transmissive conductive layer formed of, for example, ITO (indium tin oxide), is provided. The TFT 60 is interposed between the pixel electrode 9, the scanning line 18a, and the data line 16. The TFT 60 includes a semiconductor layer 33 formed of amorphous silicon (a-Si), a gate electrode 18b formed below the semiconductor layer 33 (at the substrate side), a source electrode 34 and a drain electrode 35 which are formed on the semiconductor layer 33.

The gate electrodes 18b are formed by branching off a part of the scanning line 18a toward the pixel electrodes 9, and in a front end portion of the gate electrode 18b, the gate electrode 18b is opposite to the semiconductor layer 33 with an insulating layer (gate insulating layer: not shown) interposed therebetween in a direction perpendicular to the plane of the drawing. The source electrodes 34 are formed by branching off a part of the data line 16 in the direction in which the scanning lines 18a extend, and each of the source electrodes 34 is electrically connected to the semiconductor layer 33 (source region). One end (left end) of the drain electrode 35 is electrically connected to the semiconductor layer 33 (drain region), and the other end (right end) of the drain electrode 35 is electrically connected to the pixel electrode 9.

In such a configuration, since the TFT 60 is turned on only for a predetermined period of time by means of a gate signal supplied through the corresponding scanning line 18a, the TFT 60 can serve as a switching element in which an image signal supplied from the corresponding data line 16 is written into the liquid crystal at a predetermined timing.

FIG. 5 is a cross-sectional view taken along the line V-V of FIG. 4 when the liquid crystal device 100 is a reflective liquid crystal device or a transmissive liquid crystal device. Referring to the cross-sectional configuration shown in FIG. 5, the TFT array substrate 10 mainly includes the TFT 60, which is formed on an inner surface (upper surface in FIG. 5) of a glass substrate P, and the pixel electrode 9.

The gate electrodes 18b (scanning lines 18a) are formed on the glass substrate P, and a gate insulating layer 43 formed of silicon oxide or silicon nitride is formed to cover the gate electrode 18b. In addition, the semiconductor layer 33 is formed so as to overlap the gate electrode 18b on the gate insulating layer 43.

The semiconductor layer 33 includes an amorphous silicon layer 33a and an $N^+$ silicon layer 33b stacked on the amorphous silicon layer 33a. The $N^+$ silicon layer 33b is formed to be separated into two parts on the amorphous silicon layer 33a in plan view. Specifically, one (left side in FIG. 5) $N^+$ silicon layer 33b is electrically connected to the source electrode 34 that extends on the gate insulating layer 43 so as to be positioned on the one $N^+$ silicon layer 33b, and the other (right side in FIG. 5) $N^+$ silicon layer 33b is electrically connected to the drain electrode 35 that extends on the gate insulating layer 43 so as to be positioned on the other $N^+$ silicon layer 33b.

Furthermore, a passivation layer 44 composed of, for example, silicon nitride is formed so as to cover the source electrode 34 and the drain electrode 35. The passivation layer 44 has an opening formed on the drain electrode 35, and the pixel electrode 9 that is electrically connected to the drain electrode 35 through the opening is formed.

The pixel electrode 9 is composed of a transmissive conductive material, such as ITO, in the case of a transmissive liquid crystal device, and the pixel electrode 9 is composed of a reflective metal material, such as Al or Ag, in the case of a reflective liquid crystal device. In addition, in the case of the reflective liquid crystal device, a light scattering unit is provided at the pixel electrode 9 or the liquid crystal side in order to improve the visibility of display.

Further, on a surface of the pixel electrode 9, an alignment layer for controlling the initial alignment state of liquid crystal is provided, and a retardation film or a polarizer for controlling the polarization state of light incident on a liquid crystal layer is provided on the outer surface of the glass substrate P. In addition, in the case of the transmissive liquid crystal device, a backlight serving as an illumination unit is provided at the outer side (bottom surface side of a panel) of the TFT array substrate 10.

As shown in FIG. 1, on the inner surface (a surface facing the TFT array substrate 10) of the counter substrate 20, such as the glass substrate P, the common electrode 21 which is formed by a transmissive conductive layer is formed. In addition, in the same manner as in the TFT array substrate 10, an alignment layer is formed on the common electrode 21, and if necessary, a retardation film or a polarizer may be provided on an outer surface of the counter substrate 20.

Furthermore, the liquid crystal 50 sealed between the TFT array substrate 10 and the counter substrate 20 is mainly composed of liquid crystal molecules. As liquid crystal molecules that form a liquid crystal layer, any kind of liquid crystal molecules including nematic liquid crystal and smectic liquid crystal can be used as long as the liquid crystal molecules can be aligned. In particular, in the case of a TN (twisted nematic) liquid crystal panel, it is preferable to use nematic liquid crystal. For example, phenylcyclohexane derivative liquid crystal, biphenyl derivative liquid crystal, biphenylcyclohexane derivative liquid crystal, terphenyl derivative liquid crystal, phenylether derivative liquid crystal, phenylester derivative liquid crystal, bicyclohexane derivative liquid crystal, azomethine derivative liquid crystal, azoxy derivative liquid crystal, pyrimidine derivative liquid crystal, dioxane derivative liquid crystal, or cubane derivative liquid crystal may be used as the nematic liquid crystal.

Next, a specific configuration of the electrostatic protection circuit 71 will be described with reference to FIGS. 6A, 6B, 7A, and 7B.

Figure 6A:
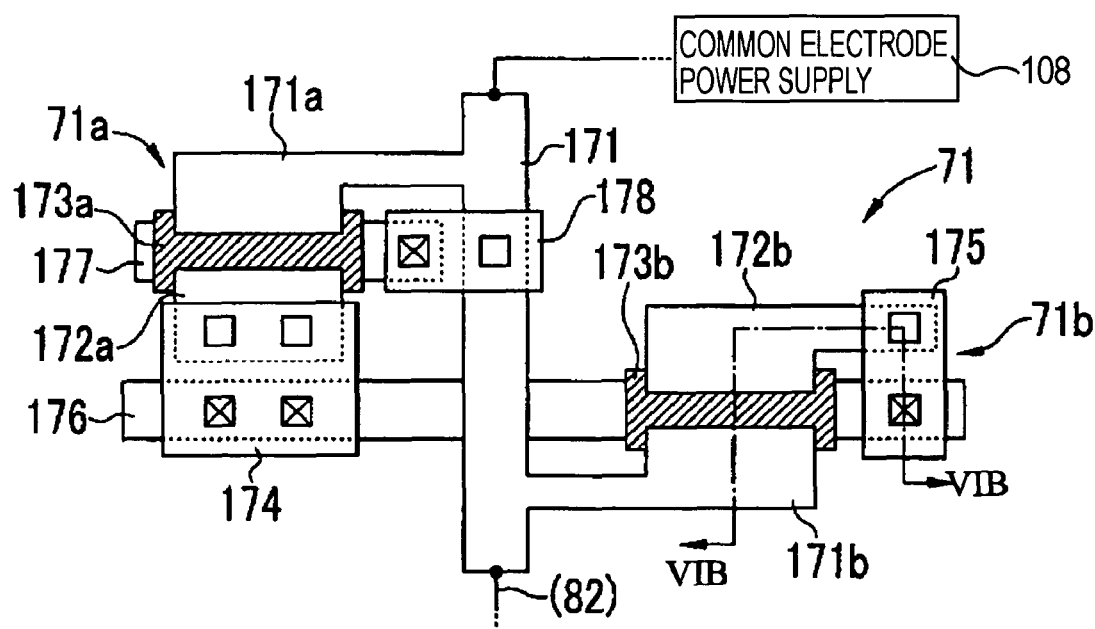
FIG. 6A is a view illustrating an example of a configuration of an electrostatic protection circuit.
Figure 6B:
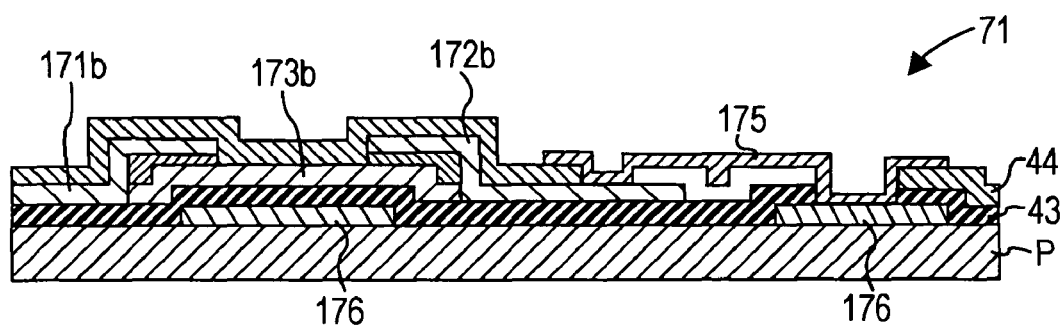
FIG. 6B is a view illustrating an example of a configuration of the electrostatic protection circuit.
Figure 7A:
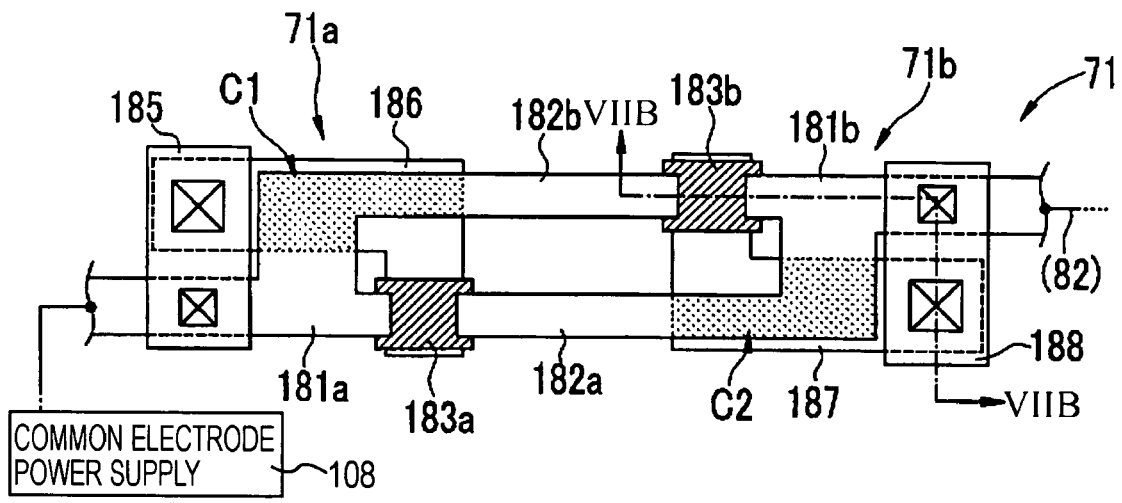
FIG. 7A is a view illustrating another example of the configuration of the electrostatic protection circuit.
Figure 7B:
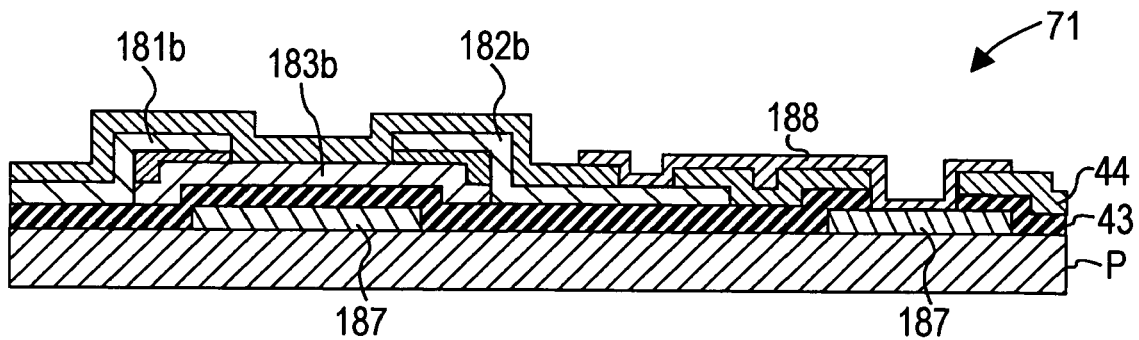
FIG. 7B is a view illustrating another example of the configuration of the electrostatic protection circuit.

FIGS. 6A and 6B are views illustrating a configuration of a MOS (metal oxide semiconductor) diode 71a that can be applied to the electrostatic protection circuit 71 (72 to 74). FIGS. 7A and 7B are views illustrating a configuration of a capacitance-coupled MOS diode that can be applied to the electrostatic protection circuit 71 (72 to 74).

First, an example of the electrostatic protection circuit 71 shown in FIGS. 6A and 6B will be described. FIG. 6A is a plan view illustrating a configuration of the electrostatic protection circuit 71, and FIG. 6B is a cross-sectional view taken along the line VIB-VIB of FIG. 6A.

The electrostatic protection circuit 71 shown in FIG. 6A is formed by connecting a first MOS diode 71a and a second MOS diode 71b in opposite directions, each of the first MOS diode 71a and the second MOS diode 71b being formed by making a gate and a drain of the TFT short-circuited. The first MOS diode 71a includes a semiconductor layer 173a, a gate electrode 177 formed on a bottom surface (facing the substrate P) of the semiconductor layer 173a, and a source electrode 171a and a drain electrode 172a which are electrically connected to the semiconductor layer 173a. The source electrode 171a is formed by branching off a source-side wiring line 171. The source-side wiring line 171 and the gate electrode 177 are electrically connected to each other through a contact hole and a relay electrode 178. In addition, the drain electrode 172a is electrically connected to the gate electrode 176 through a contact hole and a relay electrode 174.

On the other hand, the second MOS diode 71b includes a gate wiring line (gate electrode) 176, a semiconductor layer 173b formed to overlap the corresponding gate electrode 176 in plan view, and a source electrode 171b and a drain electrode 172b which are electrically connected to the semiconductor layer 173b. The drain electrode 172b and the gate wiring line 176 are electrically connected to each other through a contact hole and a relay electrode 175. The source electrode 171b is formed by branching off the source-side wiring line 171.

Referring to the cross-sectional configuration shown in FIG. 6B, the gate wiring line 176 is formed on the substrate P and the gate insulating layer 43 is formed so as to cover the gate wiring line 176. In addition, the semiconductor layer 173b (amorphous silicon layer and N+ silicon layer) is formed on the gate insulating layer 43 overlapping the gate wiring line 176 in plan view, and the source electrode 171b and the drain electrode 172b are respectively formed on both edge portions of a surface of the semiconductor layer 173b. In addition, the passivation layer 44 is formed to cover the source electrode 171b and the drain electrode 172b. A part of the passivation layer 44 on the drain electrode 172b is formed with an opening, and a part of the gate insulating layer 43 and a part of the passivation layer 44, which are located on the gate wiring line 176 shown at the right side in FIG. 6B, are formed with an opening. The drain electrode 172b and the gate wiring line 176 are electrically connected to each other by the relay electrode 175 partially embedded in the opening.

In the electrostatic protection circuit 71 having the configuration described above, when an electrical surge occurs at the connection wiring line 82, the electrostatic protection circuit 71 changes to the low impedance state so as to be turned on, as explained before. Accordingly, the surge can flow through the common electrode wiring line so that switching elements in the display region 110 can be protected.

Here, comparing the configuration of the electrostatic protection circuit 71 with that of the TFT 60, the gate wiring line 176 (and the gate electrode 177) is located at the same layer as the gate electrode 18b (scanning line 18a) of the TFT 60, and the source electrodes 171a and 171b and the drain electrodes 172a and 172b are located at the same layer as the source electrode 34 (data line 16) and the drain electrode 35 of the TFT 60. In addition, the relay electrode 175 (174 and 178) is located at the same layer as the pixel electrode 9 connected to the TFT 60.

Therefore, the electrostatic protection circuit 71 according to the present embodiment can be formed at the same time as the pixels 19 forming the display region 110 are formed during a process of manufacturing the TFT array substrate 10.

Next, another example of the electrostatic protection circuit 71 shown in FIGS. 7A and 7B will be described. FIG. 7A is a plan view illustrating a configuration of the electrostatic protection circuit 71, and FIG. 7B is a cross-sectional view taken along the line VIIB-VIIB of FIG. 7A.

The electrostatic protection circuit 71 shown in FIG. 7A is formed by connecting a first MOS diode 71a and a second MOS diode 71b in opposite directions, each of the first MOS diode 71a and the second MOS diode 71b being formed by making a gate and a drain of the TFT short-circuited. The first MOS diode 71a includes a semiconductor layer 183a, a gate electrode 186 formed on a bottom surface (facing the substrate P) of the semiconductor layer 183a, and a source electrode 181a and a drain electrode 182a which are electrically connected to the semiconductor layer 183a. The source electrode 181a extends to the left side of the drawing so as to be electrically connected to the common electrode power supply 108. The source electrode 181a and the gate electrode 186 are electrically connected to each other through a contact hole and a relay electrode 185. In addition, the drain electrode 182a extends to the second MOS diode 71b so as to be electrically connected to a source electrode 181b of the second MOS diode 71b. A drain electrode 182b of the second MOS diode 71b is formed by branching off the source electrode 181a so as to extend toward the second MOS diode 71b.

The source electrode 181a and the gate electrode 186 of the first MOS diode 71a are disposed to partially overlap each other in plan view, such that a capacitor C1 is formed at the overlapping location.

On the other hand, the second MOS diode 71b includes a semiconductor layer 183b and a source electrode 181b and a drain electrode 182b which are electrically connected to the semiconductor layer 183b. The source electrode 181b and a gate electrode 187 are electrically connected to each other through a contact hole and a relay electrode 188. The source electrode 181b extends to the right side of the drawing so as to be electrically connected to the connection wiring line 82.

The source electrode 181b and the gate electrode 187 of the second MOS diode 71b are disposed to partially overlap each other in plan view, such that a capacitor C2 is formed at the overlapping location.

Referring to the cross-sectional configuration shown in FIG. 7B, the gate electrode 187 is formed on the substrate P and the gate insulating layer 43 is formed so as to cover the gate electrode 187. In addition, the semiconductor layer 183b (amorphous silicon layer and N+ silicon layer) is formed on the gate insulating layer 43 overlapping the gate electrode 187 in plan view, and the source electrode 181b and the drain electrode 182b are respectively formed on both edge portions of a surface of the semiconductor layer 183b. In addition, the passivation layer 44 is formed to cover the source electrode 181*b* and the drain electrode 182*b*. A part of the passivation layer 44 on the drain electrode 182*b* is formed with an opening, and a part of the gate insulating layer 43 and a part of the passivation layer 44, which are located on the gate electrode 187 shown at the right side in FIG. 7B, are formed with an opening. The drain electrode 182*b* and the gate electrode 187 are electrically connected to each other by the relay electrode 188 partially embedded in the opening.

Here, comparing the configuration of the electrostatic protection circuit 71 with that of the TFT 60, the gate electrode 187 (and the gate electrode 186) is located at the same layer as the gate electrode 18*b* (scanning line 18*a*) of the TFT 60, and the source electrodes 181*a* and 181*b* and the drain electrodes 182*a* and 182*b* are located at the same layer as the source electrode 34 (data line 16) and the drain electrode 35 of the TFT 60. In addition, the relay electrode 188 (185) is located at the same layer as the pixel electrode 9 connected to the TFT 60.

Therefore, the electrostatic protection circuit 71 according to the present embodiment can be formed at the same time as the pixels 19 forming the display region 110 are formed during a process of manufacturing the TFT array substrate 10.

Since the electrostatic protection circuit 71 described with reference to FIGS. 7A and 7B includes the capacitance-coupled MOS diodes 71*a* and 71*b* connected in opposite directions to each other, the electrostatic protection circuit 71 shown in FIGS. 7A and 7B is determined to be more suitable as an electrostatic protection circuit of an electro-optical device than the electrostatic protection circuit 71 shown in FIGS. 6A and 6B. In general, a MOS diode in which a gate and a drain of a TFT are short-circuited does not serve as a protection circuit if the gate and the drain are not connected to each other. However, in the electrostatic protection circuit 71 shown in FIGS. 7A and 7B, even if the relay electrodes 185 and 188 are not provided, the first MOS diode 71*a* can operate due to the capacitance ratio between the capacitor C1 and the gate insulating layer 43 and the second MOS diode 71*b* can operate due to the capacitance ratio between the capacitor C2 and the gate insulating layer 43. Specifically, in the case when the electrostatic protection circuit 71 and the pixels 19 are formed at the same time during the same process, the MOS diodes shown in FIGS. 6A and 6B do not operate as protection circuits until the pixel electrodes 9 are formed; however, the capacitance-coupled MOS diodes shown in FIGS. 7A and 7B operate as the protection circuits if source and drain electrodes thereof are formed. Accordingly, it is possible to operate the protection circuit in an early stage of a manufacturing process. As a result, the TFTs 60 can be more effectively protected.

As described above with reference to the drawings, since the liquid crystal device 100 according to the present embodiment includes the first sealed wiring portion 91 surrounding the display region 110 and the second sealed wiring portion 92 surrounding the first sealed wiring portion 91, which are formed on the TFT array substrate 10, it is possible to obtain the high resistance to the static electricity. In addition, since the first and second sealed wiring portions 91 and 92 are provided in a liquid crystal device which is an end product, circuits can be reliably protected against static electricity while the liquid crystal device is being used as well as during a process of manufacturing the liquid crystal device. As a result, it is possible to provide a highly reliable liquid crystal device.

Further, the first and second sealed wiring portions 91 and 92 can be formed at the same time as the pixels 19 in the display region 110 are formed, and the electrostatic protection circuits provided in the liquid crystal device according to the present embodiment can be formed at the same time as the pixels 19 in the display region 110 are formed. Therefore, in the present embodiment, it is possible to improve the reliability of the liquid crystal device without increasing the number of manufacturing processes.

Second Embodiment

Figure 8:
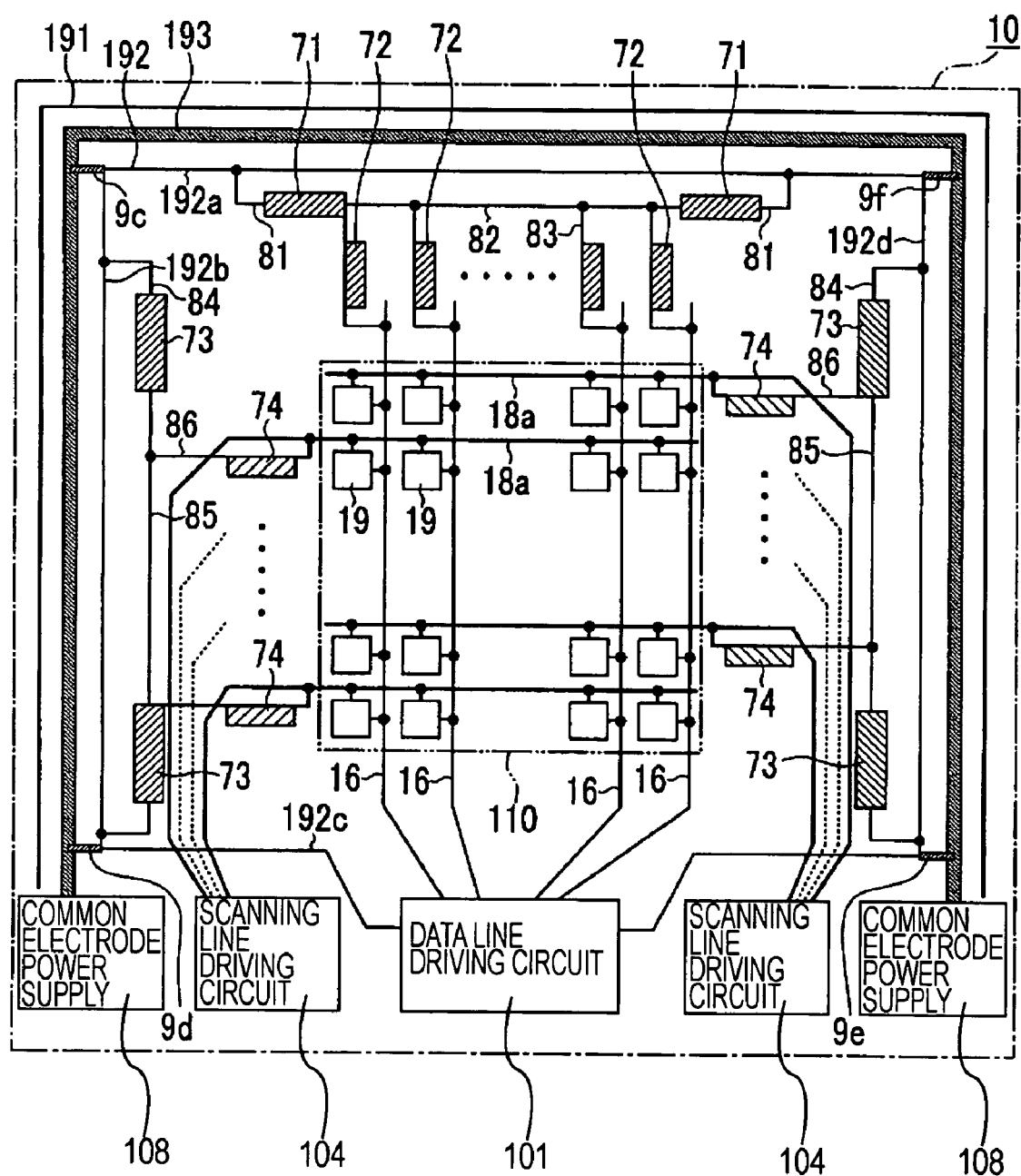
FIG. 8 is a circuit diagram schematically illustrating a configuration of a TFT array substrate according to a second embodiment of the invention.

Hereinafter, a second embodiment of the invention will be described with reference to FIG. 8. FIG. 8 is a circuit diagram schematically illustrating a configuration of a TFT array substrate 10. The second embodiment is the same as the first embodiment except for the circuit configuration shown in FIG. 8, and accordingly, detailed explanation on the same components will be omitted.

As shown in FIG. 8, on the TFT array substrate 10 of the liquid crystal device according to the present embodiment, a display region 110 in which a plurality of pixels 19 is arranged in a matrix in plan view is provided. Further, a data line driving circuit 101, two scanning line driving circuits 104, and two common electrode power supplies 108, which are disposed along one side of the TFT array substrate 10 located below the display region 110, are also provided on the TFT array substrate 10. Data lines 16 extending from the data line driving circuit 101 are electrically connected to the pixels 19, respectively, and scanning lines 18*a* extending from the scanning line driving circuits 104 are electrically connected to the pixels 19, respectively.

Each of the data lines 16 extending from the display region 110 to the upper side of the drawing is electrically connected to each electrostatic protection circuit 72. Each of the electrostatic protection circuits 72 is electrically connected to a wiring member 192*a*, which extends in the left and right directions toward ends of the TFT array substrate 10, through two electrostatic protection circuits 71. Each of the scanning lines 18*a* extending from the display region 110 to the left and right sides of the drawing is electrically connected to each electrostatic protection circuit 74. Each of the electrostatic protection circuits 74 located at the left side of the drawing is electrically connected to a wiring member 192*b* through two electrostatic protection circuits 73, and each of the electrostatic protection circuits 74 located at the right side of the drawing is electrically connected to a wiring member 192*d* through two electrostatic protection circuits 73.

The liquid crystal device according to the present embodiment includes: a first sealed wiring portion 191 having a wiring member that extends along three sides of the TFT array substrate 10 so as to have a U-shape in plan view; a second sealed wiring portion 192 having four wiring members 192*a*, 192*b*, 192*c*, and 192*d* disposed to surround the display region 110; and a third sealed wiring portion 193 having a common electrode wiring line that is provided between the first sealed wiring portion 191 and the second sealed wiring portion 192 so as to have a U-shape in plan view.

The wiring members 192*a*, 192*b*, 192*c*, and 192*d* forming the second sealed wiring portion 192 are electrically connected to each other, and the wiring members 192*a*, 192*b*, 192*c*, and 192*d* are also electrically connected to the third sealed wiring portion 193 (common electrode wiring line) through connecting members 9*c*, 9*d*, 9*e*, and 9*f* disposed at a top portion of the TFT array substrate 10. In addition, the wiring member 192*c* is disposed to pass through a bottom surface (facing the substrate P) of the data line driving circuit 101. Here, even though the data lines 16 located on the same layer as the wiring member 192*c* are connected to the data line driving circuit 101, the wiring member 192*c* can be disposed to pass through an IC chip mounting area so that the wiring member 192c does not interfere with the data lines 16.

The first sealed wiring portion 191 is formed on the same layer as the scanning lines 18a by using the same material as the scanning lines 18a. Further, the second sealed wiring portion 192 and the third sealed wiring portion 193 are formed on the same layer as the data lines 16 by using the same material as the data lines 16. Accordingly, even in this embodiment, the first, second, and third sealed wiring portions 191, 192, and 193 can be formed at the same time as the pixels 19 of the display region 110 are formed.

Since the liquid crystal device according to the present embodiment includes the three sealed wiring portions 191, 192, and 193 disposed to surround the display region 110, it is possible to obtain higher resistance to the static electricity than in the liquid crystal device according to the first embodiment. Accordingly, since the liquid crystal device is not easily damaged during the manufacturing process, the liquid crystal device can be manufactured with a high yield. As a result, a highly reliable liquid crystal device can be provided.

Electronic Apparatus

Figure 9:
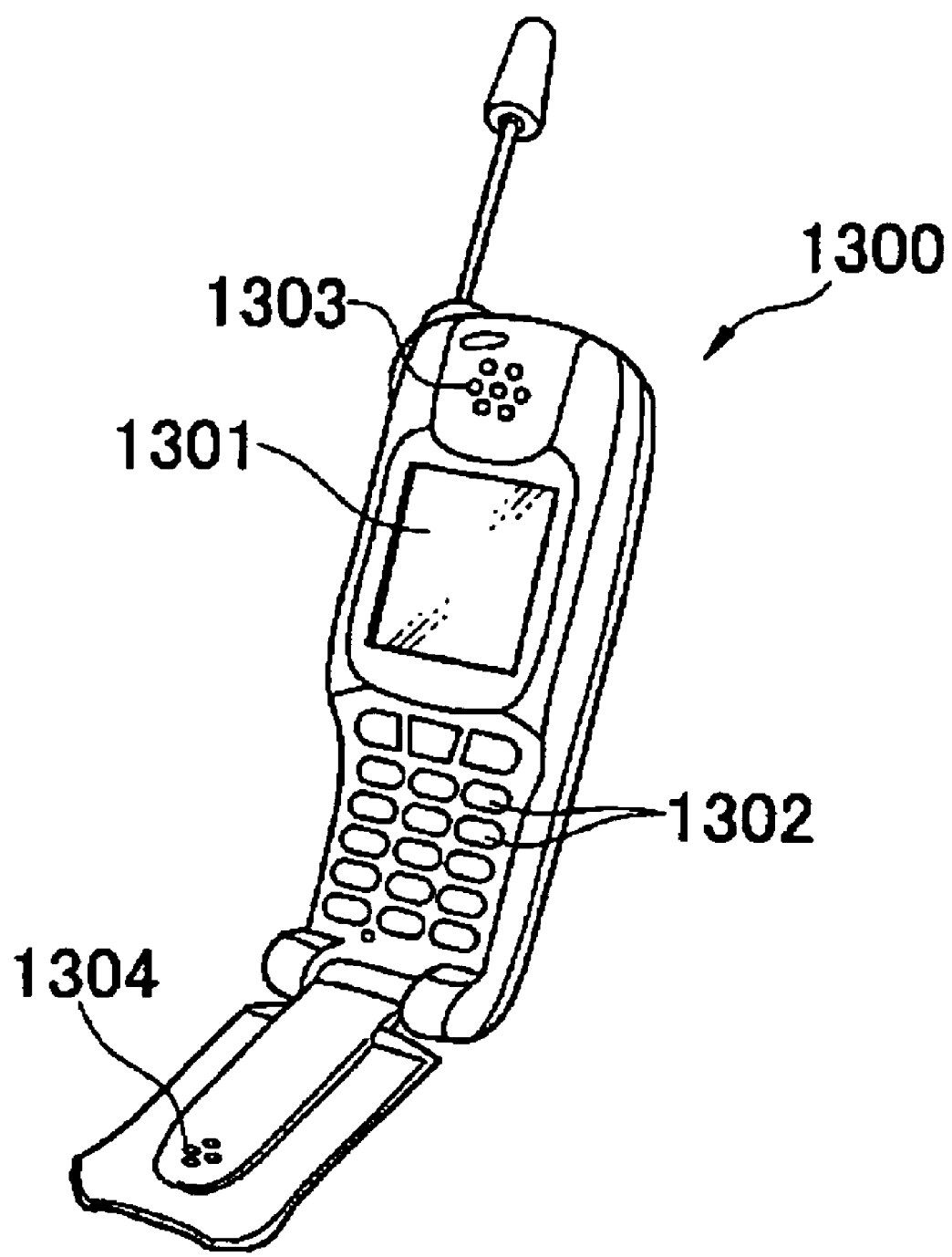
FIG. 9 is a perspective view illustrating an example of an electronic apparatus.

FIG. 9 is a perspective view illustrating an example of an electronic apparatus according to another embodiment of the invention. A mobile phone 1300 shown in FIG. 9 includes a small display unit 1301 using the liquid crystal device according to any one of the embodiments of the invention, a plurality of operation buttons 1302, an earpiece 1303, and a mouthpiece 1304.

An electro-optical device according to any one of the invention is not limited to the mobile phone, but can be used as image display units of various electronic apparatuses, such as an electronic book, a personal computer, a digital still camera, a liquid crystal television, a viewfinder-type or monitor-direct-view-type video tape recorder, a car navigation device, a pager, an electronic organizer, an electronic calculator, a word processor, a workstation, a video phone, a POS terminal, or a device having a touch panel. In any case described above, a highly reliable display unit can be provided, and accordingly, the reliability of an electronic apparatus is highly improved.

What is claimed is:

1. An electro-optical device having a display region in which a plurality of pixels are arranged in a matrix, comprising:
    switching elements each corresponding to one of the plurality of pixels;
    a first sealed wiring portion that is formed in a rectangular shape arranged outside of and surrounding the entire display region; and
    a second sealed wiring portion that is formed on an element substrate so as to be arranged outside of the first sealed wiring portion and to surround only three sides of the display region, the second sealed wiring portion including a common electrode wiring line surrounding a first side of the display region, a second side of the display region, and a portion of a third side of the display region, the common electrode wiring line having a width greater than a width of the first sealed wiring portion,
    wherein the first sealed wiring portion includes a fourth side other than the three sides at which the second sealed wiring portion is arranged,
    wherein a data line that is connected to a data line driving circuit includes a first electrostatic protection circuit and the data line is connected to the portion of the common electrode wiring line on the second side of the display region through a second electrostatic protection circuit, and a scanning line includes a third electrostatic protection circuit and the scanning line is connected to the portion of the common electrode wiring line on the first side of the display region through a fourth electrostatic protection circuit, and
    wherein the first sealed wiring portion is connected to the data line through a first connecting member, then through the common electrode wiring line, and then through the second electrostatic protection circuit and the first electrostatic protection circuit, the first sealed wiring portion is also connected to the scanning line through a second connecting member and then through the fourth electrostatic protection circuit and the third electrostatic protection circuit, and the first sealed wiring portion is not directly connected to the data line driving circuit.

2. The electro-optical device according to claim 1, wherein the first sealed wiring portion is electrically connected to a common electrode that is formed to correspond to the plurality of pixels.

3. The electro-optical device according to claim 1, wherein each of the switching elements includes a thin film transistor having a gate electrode formed on the element substrate, a semiconductor layer opposite to the gate electrode with a gate insulating layer interposed therebetween, and a source electrode and a drain electrode which are electrically connected to the semiconductor layer, and
    any one of the first and second sealed wiring portions is formed on a same layer as the source electrode and the drain electrode by using a same material as the source electrode and the drain electrode.

4. The electro-optical device according to claim 3, wherein any one of the first and second sealed wiring portions is formed on a same layer as the gate electrode by using a same material as the gate electrode.

5. The electro-optical device according to claim 3, further comprising:
    pixel electrodes each of which is electrically connected to the corresponding switching elements through the source electrode and the drain electrode,
    wherein any one of the first and second sealed wiring portions is formed on a same layer as the pixel electrodes by using a same material as the pixel electrodes.

6. The electro-optical device according to claim 1, further comprising:
    a plurality of data lines formed on the element substrate; and
    a plurality of scanning lines formed on the element substrate so as to intersect the plurality of data lines,
    wherein the pixels are respectively formed to correspond to intersections of the data lines and the scanning lines.

7. The electro-optical device according to claim 6, wherein at least one of the electrostatic protection circuits includes a MOS diode having a semiconductor layer that is formed on a same layer as thin film transistors which form the switching elements.

8. The electro-optical device according to claim 7, wherein at least one of the electrostatic protection circuits is formed by connecting a first MOS diode and a second MOS diode in opposite directions, each of the first and second MOS diodes being formed by making a gate electrode and a drain electrode of the corresponding thin film transistors short-circuited.

9. The electro-optical device according to claim 8, wherein the first MOS diode is a capacitance-coupled MOS diode in which a source electrode and a gate electrode overlap each other in plan view, and the second MOS diode is a capacitance-coupled MOS diode in which a source electrode and a gate electrode partially overlap each other in plan view.

10. The electro-optical device according to claim 9, wherein the capacitance-coupled MOS diode is electrically connected to the corresponding sealed wiring portion formed on a same layer as the data lines.

11. An electronic apparatus comprising the electro-optical device according to claim 1.

12. The electro-optical device according to claim 1, wherein the fourth side of the first sealed wiring portion includes one end that terminates without being electrically connected to any other portion of the electro-optical device.

13. The electro-optical device according to claim 1, wherein sides of the first sealed wiring portion on the second and third sides of the display region are connected to the common electrode wiring line through the first connecting member, and sides of the first sealed wiring portion on the first and second sides of the display region are connected to the common electrode wiring line through the second connecting member.

* * * * *